(12) United States Patent
Lee et al.

(10) Patent No.: US 12,328,854 B2
(45) Date of Patent: Jun. 10, 2025

(54) POWER CONVERTER

(71) Applicant: LG INNOTEK CO., LTD., Seoul (KR)

(72) Inventors: Mi Sun Lee, Seoul (KR); Sang Hun An, Seoul (KR); Ji Hwan Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 221 days.

(21) Appl. No.: 18/019,005

(22) PCT Filed: Aug. 2, 2021

(86) PCT No.: PCT/KR2021/010063
§ 371 (c)(1),
(2) Date: Jan. 31, 2023

(87) PCT Pub. No.: WO2022/025735
PCT Pub. Date: Feb. 3, 2022

(65) Prior Publication Data
US 2023/0247808 A1 Aug. 3, 2023

(30) Foreign Application Priority Data

Jul. 31, 2020 (KR) .......................... 10-2020-0096143

(51) Int. Cl.
*H05K 7/20* (2006.01)
*H02M 7/00* (2006.01)

(52) U.S. Cl.
CPC ........ *H05K 7/20927* (2013.01); *H02M 7/003* (2013.01); *H05K 7/20263* (2013.01)

(58) Field of Classification Search
CPC ............... H01L 23/427; H01L 23/4093; H01L 21/4882; H01L 23/4006; G06F 1/203; G06F 1/20; G06F 2200/201; F28D 15/0275; H05K 1/0203; H05K 7/20172; H05K 7/20254; H05K 7/20509; H05K 7/205; H05K 7/20936
See application file for complete search history.

(56) References Cited

U.S. PATENT DOCUMENTS 6,301,107 B1   10/2001   Lev et al.
6,304,441 B1 *  10/2001   Han ..................... H01L 23/3672
                                                    361/679.48

(Continued)

FOREIGN PATENT DOCUMENTS

KR         10-1605274 B1      3/2016

*Primary Examiner* — Mandeep S Buttar
(74) *Attorney, Agent, or Firm* — Birch, Stewart, Kolasch & Birch, LLP

(57) ABSTRACT

A power converter comprises: a housing which has an inner space part formed therein; an electronic component which is disposed in the space part and generates heat due to the operation thereof; and a heat dissipating member a part of which is disposed on the electronic component and the other part of which is disposed at the inner surface of the housing, wherein the heat dissipating member comprises: a frame; a heat dissipating pipe disposed at one surface of the frame; and a thermal pad disposed between the heat dissipating pipe and the electronic component or between the heat dissipating pipe and the inner surface of the housing.

15 Claims, 8 Drawing Sheets

(56) References Cited

U.S. PATENT DOCUMENTS

| | | | | |
|---|---|---|---|---|
| 2002/0097558 | A1* | 7/2002 | Stone | G06F 1/203 |
| | | | | 361/689 |
| 2003/0099091 | A1* | 5/2003 | Ishikawa | G06F 1/203 |
| | | | | 361/695 |
| 2005/0045310 | A1* | 3/2005 | Okutsu | F28D 15/04 |
| | | | | 257/E23.099 |
| 2006/0279926 | A1* | 12/2006 | Koo | G06F 1/20 |
| | | | | 361/689 |
| 2007/0279868 | A1* | 12/2007 | Tanaka | G06F 1/203 |
| | | | | 361/702 |
| 2009/0142956 | A1* | 6/2009 | Ma | H01L 23/4006 |
| | | | | 439/485 |
| 2009/0205810 | A1 | 8/2009 | Wan et al. | |
| 2014/0138073 | A1 | 5/2014 | Teraki | |
| 2015/0301568 | A1 | 10/2015 | Hill et al. | |

* cited by examiner

POWER CONVERTER

CROSS REFERENCE TO RELATED APPLICATIONS

This application is the National Phase of PCT International Application No. PCT/KR2021/010063, filed on Aug. 2, 2021, which claims priority under 35 U.S.C. 119 (a) to Patent Application No. 10-2020-0096143, filed in the Republic of Korea on Jul. 31, 2020, all of which are hereby expressly incorporated by reference into the present application.

TECHNICAL FIELD

This embodiment relates to a power converter.

BACKGROUND ART

Recently, countries around the world are making various attempts to replace existing fossil energy resources. First of all, for the use of nature-friendly energy, intensive investment in the renewable energy industry for the use of nature-friendly energy and the energy distribution and storage industry for energy efficiency improvement has been going on, and in Korea, various policies for the energy industry are being planned and underway due to the shutdown of nuclear power plants and power outages following the earthquake in Japan, and looking at this trend of the times, demand for new and renewable energy is increasing, and in line with this, technologies for efficiently managing power, such as smart grids, are also being actively researched.

The problem of using energy efficiently leads to an analysis of demand patterns such as the place and time of users who use energy, and the core concept of smart grid is how to distribute the produced energy in consideration of the user's demand patterns. Therefore, in order to store the produced energy in a certain time or space and supply it according to the usage pattern of the consumer, a storage device in which the produced energy can be stored, that is, a battery, is required, and the concept of expanding these batteries is called an energy storage system (ESS).

An energy storage system (ESS) is an energy storage system that controls various voltages and currents generated from distributed power or renewable energy to connect to a power system as needed or to store and use idle energy. The power conversion system (PCS) is a system that converts characteristics of electricity, that is, AC/DC, voltage, frequency, and the like to receive power from a power source within the energy storage system (ESS) and store it in a battery or discharge it to the grid.

As an example of a power converter, a DC-DC converter refers to an electronic circuit device that converts DC power of a certain voltage to DC power of another voltage, and it is used in various fields such as television receivers, automotive electronic parts, and energy storage systems (ESS).

The outer shape of the power converter is formed by the housing, and a number of electronic components for driving are disposed inside the housing. The plurality of electronic component generates heat by being driven.

Accordingly, a heat dissipation member for absorbing heat generated from the electronic component may be disposed in the housing for heat dissipation. The heat dissipation member is in contact with the electronic component and may transfer heat generated by the electronic component to another region (for an example, a housing).

However, considering the narrow space inside the housing, there is a structural difficulty in arranging the electronic component and the heat dissipation member in a single housing.

DETAILED DESCRIPTION OF THE INVENTION

Technical Subject

The present embodiment relates to a power converter capable of securing a wide space in a housing by improving a structure and improving heat dissipation efficiency.

Technical Solution

A power converter according to the present embodiment comprises: a housing which has an inner space part formed therein; an electronic component being disposed in the space part and generating heat due to the operation thereof; and a heat dissipating member, a part thereof being disposed on the electronic component and the other part thereof being disposed on an inner surface of the housing, wherein the heat dissipating member comprises: a frame; a heat dissipating pipe being disposed on one surface of the frame; and a thermal pad being disposed between the heat dissipating pipe and the electronic component or between the heat dissipating pipe and an inner surface of the housing.

The housing includes: an upper plate; a lower plate; and a side plate connecting the upper plate and the lower plate and forming a side surface, wherein the heat dissipating member may be in contact with an inner surface of the side plate.

The frame includes: a first plate portion being disposed on the electronic component; and a second plate portion facing an inner surface of the housing, wherein the first plate portion and the second plate portion may be disposed perpendicular to each other.

The heat dissipating pipe includes: a first region being disposed on a lower surface of the first plate portion; and a second region being disposed on an outer surface of the second plate portion, wherein the first region and the second region may be disposed perpendicular to each other.

An accommodating groove being formed by being more recessed inward than other regions to accommodate the second region may be disposed on an outer surface of the second plate portion.

The heat dissipating member includes a step portion being protruded downward from a lower surface of the first plate portion, wherein a plurality of heat dissipating pipes may be provided to be disposed to face each other with respect to the step portion.

The heat dissipating member includes a housing coupling portion being extended upward from an upper end of the second plate portion, wherein the housing coupling portion may be screw-coupled to an inner surface of the housing.

The thermal pad may include: a first thermal pad being disposed between the first region and an upper surface of the electronic component; and a second thermal pad being disposed between the second region and an inner surface of the housing.

The first plate portion includes a first screw hole, wherein the first thermal pad includes a second screw hole facing the first screw hole, and wherein the heat dissipating member may be screw-coupled to the electronic component through a screw penetrating the first screw hole and the second screw hole.

The heat dissipating pipe may be soldered to one surface of the frame.

Advantageous Effects

According to the present invention, heat generated according to driving of the electronic component is transferred to the housing through the heat dissipating member, so that heat dissipation efficiency can be improved.

In particular, even if other electronic component such as printed circuit boards are placed above and below the electronic component, it has the advantage of securing a wider space in the housing by dissipating heat to the side surface of the housing through a heat dissipating member that is being bent at least once.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C. In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under) ", the meaning of not only an upward direction but also a downward direction based on one component may be included.

Figure 1:
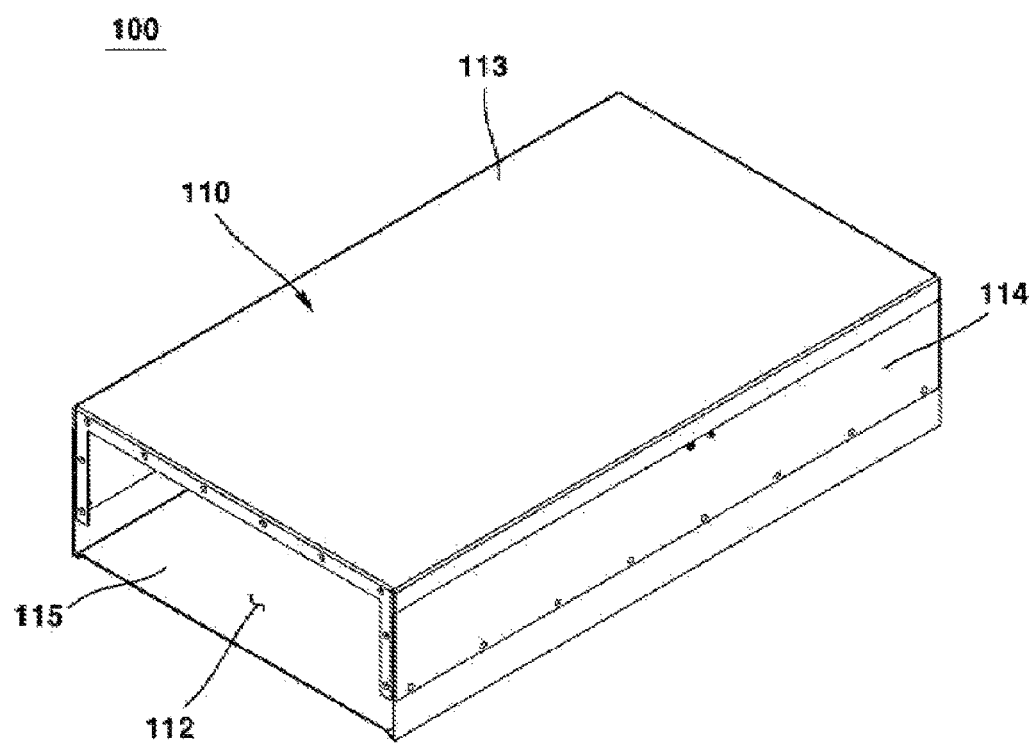
FIG. 1 is a perspective view of a power converter according to an embodiment of the present invention.
Figure 2:
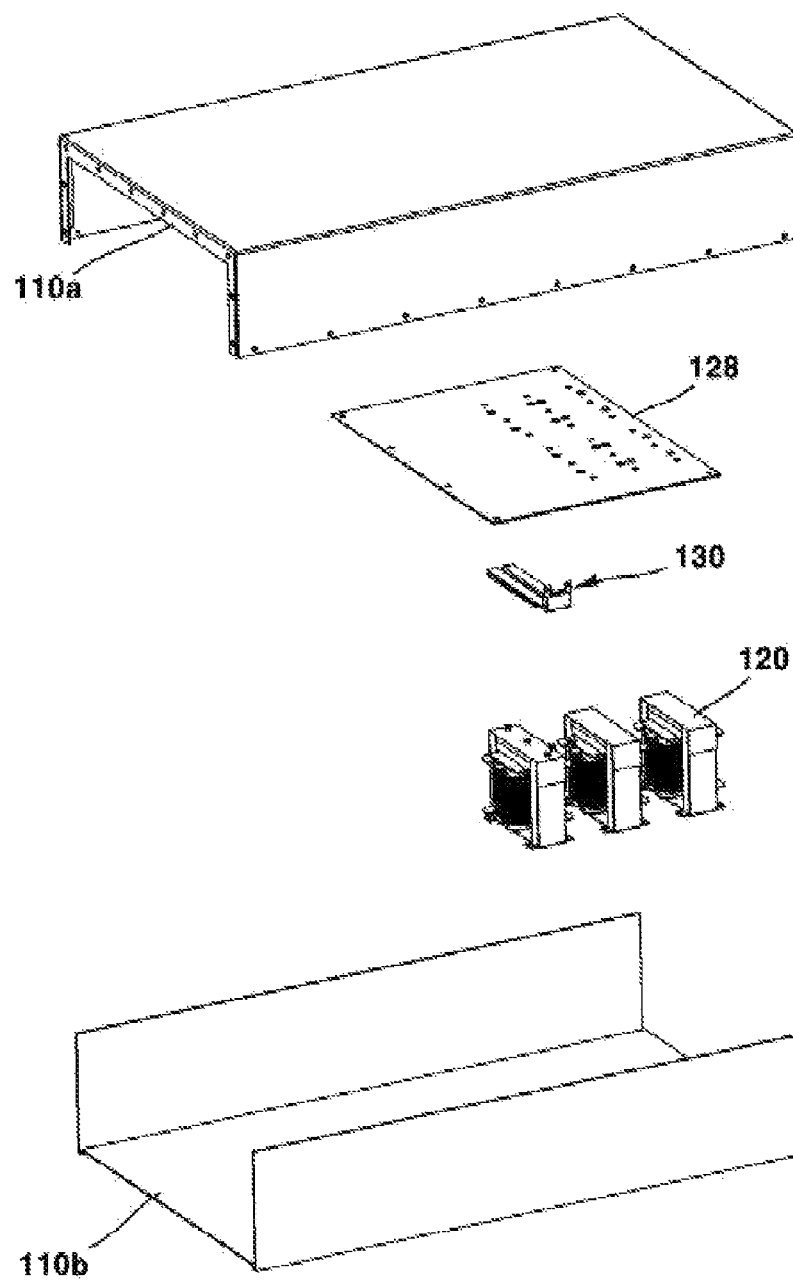
FIG. 2 is an exploded perspective view of a power converter according to an embodiment of the present invention.
Figure 3:
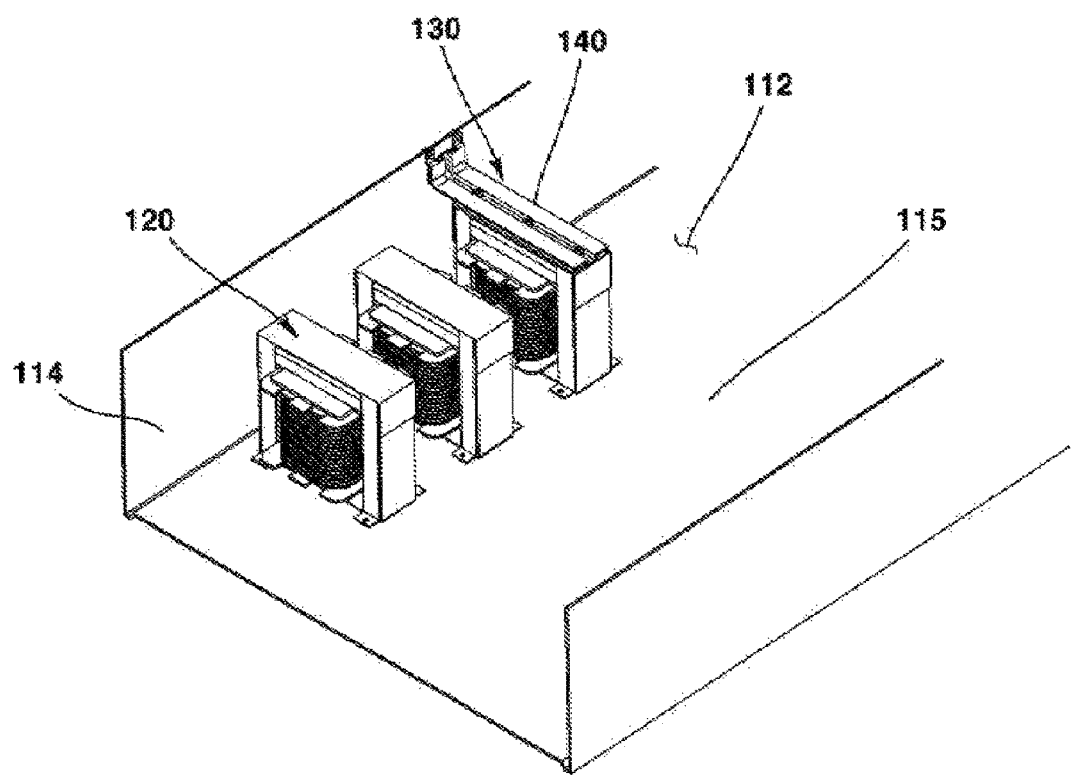
FIG. 3 is a perspective view illustrating an arrangement structure of electronic component in the housing according to an embodiment of the present invention.
Figure 4:
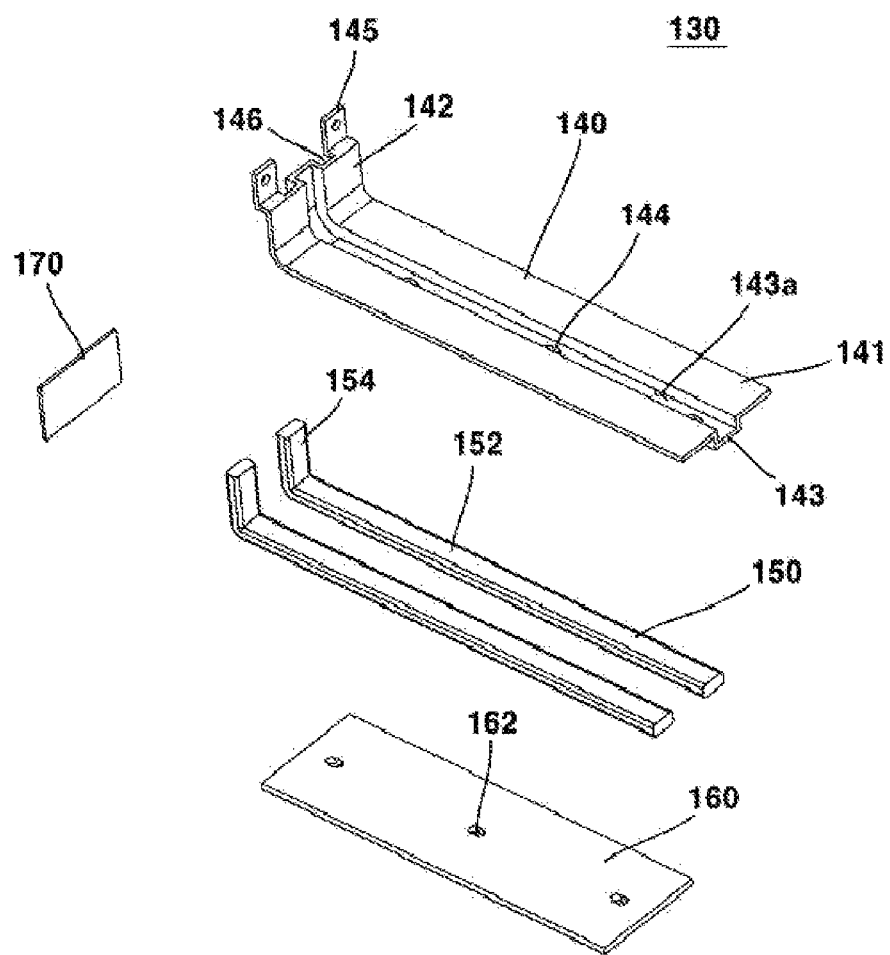
FIG. 4 is an exploded perspective view of a heat dissipating member according to an embodiment of the present invention.
Figure 5:
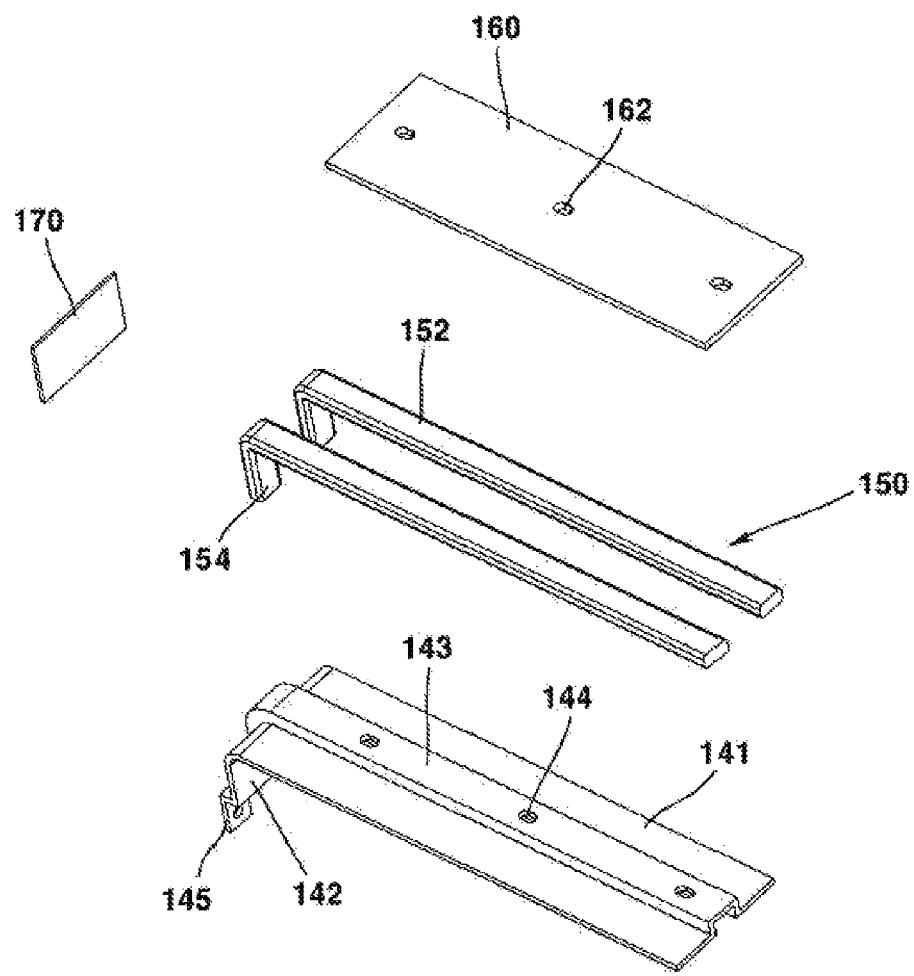
FIG. 5 is an exploded perspective view of FIG. 4 from another angle.
Figure 6:
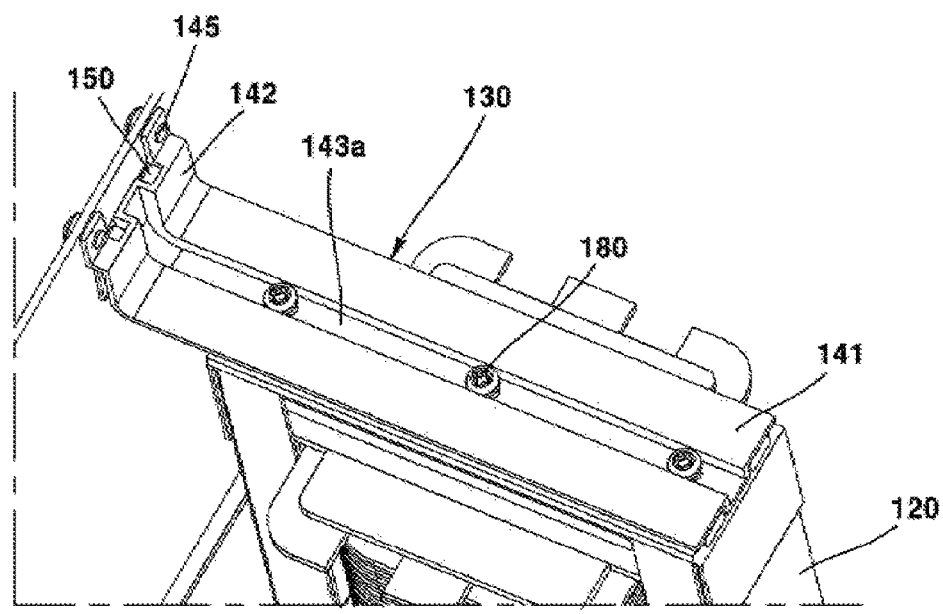
FIG. 6 is a perspective view of a heat dissipation structure of electronic component according to an embodiment of the present invention.
Figure 7:
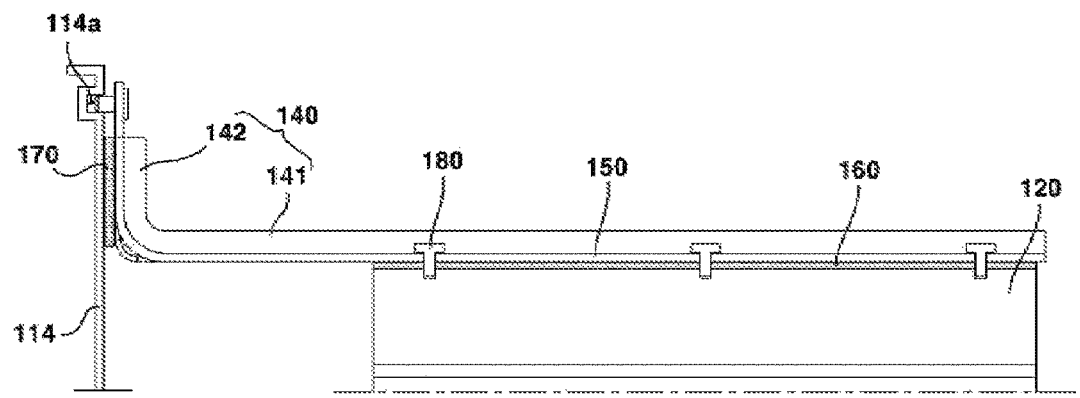
FIG. 7 is a cross-sectional view of a heat dissipation structure of electronic component according to an embodiment of the present invention.

FIG. 1 is a perspective view of a power converter according to an embodiment of the present invention; FIG. 2 is an exploded perspective view of a power converter according to an embodiment of the present invention; FIG. 3 is a perspective view illustrating an arrangement structure of electronic component in the housing according to an embodiment of the present invention; FIG. 4 is an exploded perspective view of a heat dissipating member according to an embodiment of the present invention; FIG. 5 is an exploded perspective view of FIG. 4 from another angle; FIG. 6 is a perspective view of a heat dissipation structure of electronic component according to an embodiment of the present invention; and FIG. 7 is a cross-sectional view of a heat dissipation structure of electronic component according to an embodiment of the present invention.

Referring to FIGS. 1 to 7, the outer appearance of a power converter 100 according to an embodiment of the present invention may be formed by the housing 110. The housing 110 may have a rectangular parallelepiped or regular hexahedron shape. An inner space part 112 may be formed inside the housing 110. One or more electronic component for driving the power converter 100 may be disposed in the inner space part 112.

The housing 110 may be formed by coupling a first housing 110a and a second housing 110b. The first housing 110a and the second housing 110b may be coupled in a vertical direction. A screw hole through which a screw (not shown) penetrates may be formed in a region being mutually overlapped with each other among side surfaces of the first housing 110a and the second housing 110b. Accordingly, a screw is screw-coupled into the screw hole so that the first housing 110a and the second housing 110b can be coupled to each other. This is an example, and the housing 110 may be formed as a single body.

The housing 110 may comprise: an upper plate 113 forming an upper surface and a lower plate 115 forming a lower surface; the upper plate 113; and a side plate 114 connecting the lower plate 115 and forming a side surface.

The inner space part 112 may be defined by inner surfaces of the upper plate 113, the lower plate 115, and the side plate 114, respectively.

As described above, one or more electronic component 120 for driving may be disposed in the inner space part 112. For example, the electronic component 120 may include a transformer for voltage regulation and an inductor for obtaining inductance. The electronic component 120 may generate heat by being driven. The electronic component may be provided in plurality and disposed spaced apart from each other.

A printed circuit board 128 on which a plurality of elements are mounted may be disposed at an upper portion of the electronic component 120.

A power converter 100 according to the present embodiment is disposed on the electronic component 120 for heat dissipation, and may include a heat dissipating member 130 that transfers heat generated from the electronic component 120 to the housing 110.

In detail, the heat dissipating member 130 may include a frame 140, a heat dissipating pipe 150, and thermal pads 160 and 170.

The frame 140 forms the outer shape of the heat dissipating member 130, and may include a first plate portion 141 being disposed on the electronic component 120 and a second plate portion 142 being coupled to the housing 110. The first plate portion 141 may be disposed parallel to one surface of the electronic component 130. One surface of the electronic component 130 may be a surface on which heat is generated by driving the electronic component 130. The second plate portion 142 may be disposed perpendicular to the first plate portion 141. The second plate portion 142 may be coupled to the side plate 114. A bent portion may be formed in a region where the first plate portion 141 and the second plate portion 142 meet. The second plate portion 142 may be extended from the first plate portion 141.

The first plate portion 141 may be formed in a plate shape and disposed on one side of the electronic component 120. The one side may be an upper portion of the electronic component 120, and the first plate portion 141 may be disposed in a region where heat is mainly generated by driving the electronic component 120. One region of a lower surface of the frame 140 may have a step portion 143 being protruded more downward than the other region. With respect to the step portion 143, the lower region of the frame 140 may be divided into a plurality of regions.

In addition, a central groove 143a may be formed on one surface of the first plate portion 141 by the step portion 143 that is being recessed more downward than other regions. The central groove 143a may be disposed at the center of the first plate portion 141. The central groove 143a is extended in a lengthwise direction of the first plate portion 141 and may also be formed on one surface of the second plate portion 142.

A first screw hole 144 through which a screw 180 (see FIG. 6) penetrates may be formed in a bottom portion 143 forming the central groove 143a.

The second plate portion 142 may be bent upward from one end of the first plate portion 141. An outer surface of the second plate portion 142 may be disposed to face an inner surface of the side plate 114. At an upper end of the second plate portion 142, a housing coupling portion 145 being protruded more upward than other regions and including a screw hole may be disposed. Therefore, as the screw penetrates through the screw hole to be screw-coupled to the side plate 114, the frame 140 inside the housing 110 can be firmly fixed.

An accommodating groove 146 for accommodating the heat dissipating pipe 150 may be formed on an outer surface of the second plate portion 142 by being recessed more inward than other regions. The accommodating groove 146 may accommodate the second region 154 of the heat dissipating pipe 150.

The frame 140 may be formed of a metal material.

The heat dissipating pipe 150 may be coupled to one surface of the frame 140. The heat dissipating pipe 150 may be coupled to a lower surface of the frame 140. A refrigerant may flow inside the heat dissipating pipe 150. To this end, a flow path through which the refrigerant flows may be formed inside the heat dissipating pipe 150. The refrigerant may exchange heat with the electronic component 120. The heat dissipating pipe 150 may be formed of a metal material. The heat dissipating pipe 150 may be provided in plurality and may be disposed facing each other with respect to the step portion 143.

The heat dissipating pipe 150 may be soldered to one surface of the frame 140. Accordingly, the coupled state between the heat dissipating pipe 150 and the frame 140 can be firmly fixed.

The heat dissipating pipe 150 may include a first region 152 being coupled to a lower surface of the first plate portion 141 and a second region 154 being coupled to an outer surface of the second plate portion 142. The first region 152 may be horizontally disposed in the first plate portion 141. The second region 154 may be horizontally disposed in the second plate portion 142. The second region 154 is extended from one end of the first region 152 and may be disposed perpendicular to the first region 152 with a bent region interposed therebetween. Heat generated from the electronic component 120 may be transferred to the housing 110 through the second region 154 along the first region 152.

The second region 154 may be coupled to the accommodating groove 146 being formed on an outer surface of the second plate portion 142.

The thermal pads 160 and 170 are for mutually coupling the heat dissipating pipe 150 and the electronic component 120, and the heat dissipating pipe 150 and the housing 110, and may include a first thermal pad 160 and a second thermal pad 170. The thermal pads 160 and 170 may be formed of a material having high thermal conductivity.

A first thermal pad 160 may be disposed between the first region 152 and the electronic component 120. An upper surface of the first thermal pad 160 may be in contact with a lower surface of the first region 152, and a lower surface may be in contact with an upper surface of the electronic component 120. Heat of the electronic component 120 may be transferred to the first region 152 through the first thermal pad 160. Upper and lower surfaces of the first thermal pad 160 may have adhesive strength.

The first thermal pad 160 may include a second screw hole 162 formed to penetrate from an upper surface to a lower surface in a region facing the first screw hole 144. Accordingly, a screw may be screw-coupled into the electronic component 120 through the first screw hole 144 and the second screw hole 162.

The second thermal pad 170 may be disposed between an outer surface of the second region 154 and an inner surface of the side plate 114. An inner surface of the second thermal pad 170 may be in contact with an outer surface of the second region 154, and an outer surface may be in contact with an inner surface of the side plate 114. Heat of the heat dissipating pipe 150 may be transferred to the housing 110 through the second thermal pad 170.

According to the above described structure, heat generated by the driving of the electronic component 120 is transferred to the housing 110 through the heat dissipating member 130, thereby improving heat dissipation efficiency.

In particular, even if other electronic components such as the printed circuit board 128 are disposed above and below the electronic component 120, there is an advantage in that a wider space within the housing 110 can be secured by dissipating heat to the side of the housing 110 through the heat dissipating member 130 being bent at least once. To this end, the electronic component 120 may be disposed closer to the side plate 114 than the center of the inner space part 112.

Figure 8:
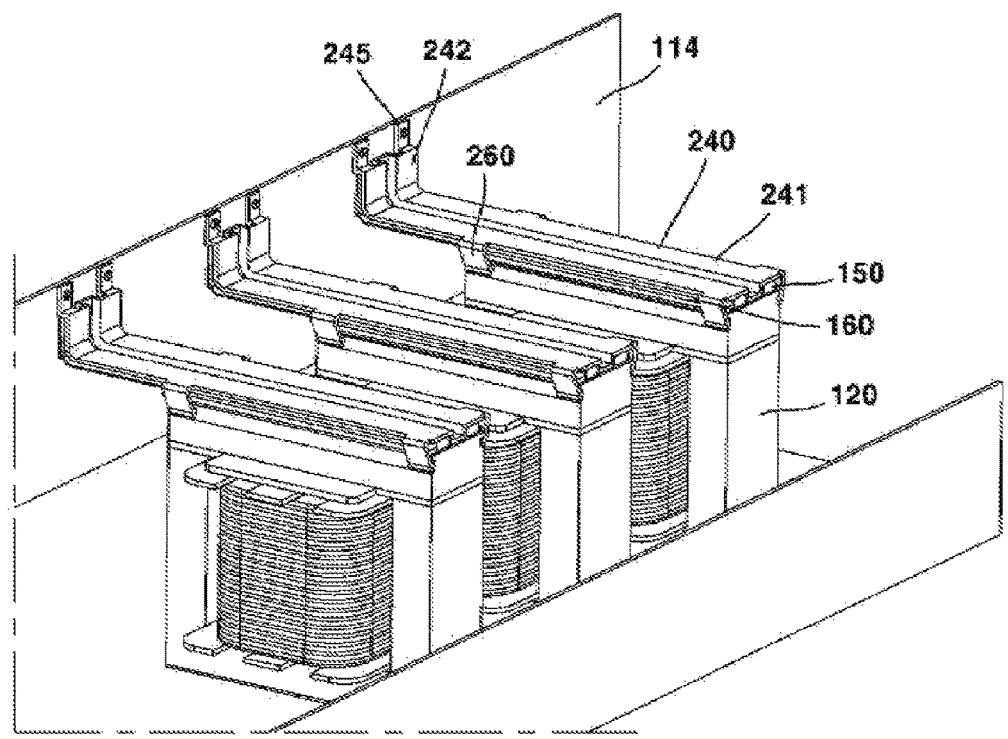
FIG. 8 is a perspective view of a heat dissipation structure of electronic component according to a second embodiment of the present invention.
Figure 9:
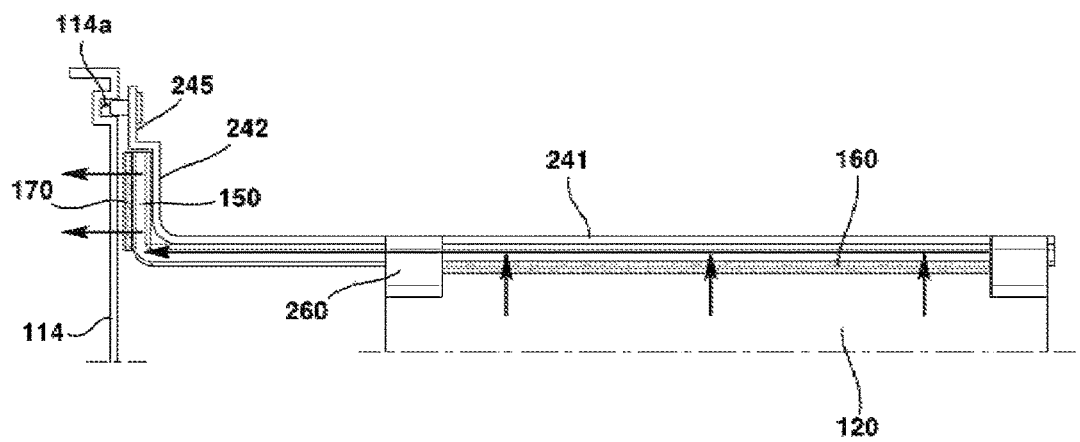
FIG. 9 is a cross-sectional view of a heat dissipation structure of electronic component according to a second embodiment of the present invention.

FIG. 8 is a perspective view of a heat dissipation structure of electronic component according to a second embodiment of the present invention; FIG. 9 is a cross-sectional view of a heat dissipation structure of electronic component according to a second embodiment of the present invention; and FIG. 10 is a cross-sectional view illustrating a coupling structure of a frame and electronic component according to a second embodiment of the present invention.

In the present embodiment, it is the same as the previous embodiment in other parts, but there is a difference in the coupling of the heat dissipating member and the electronic component. Therefore, hereinafter only the characteristic parts of the present embodiment will be explained, and for the remaining part, the description for the previous embodiment will be used.

Figure 10:
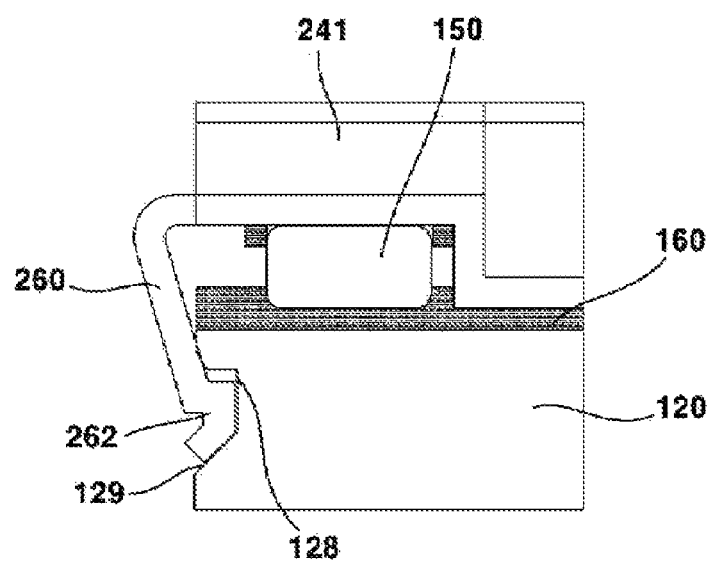
FIG. 10 is a cross-sectional view illustrating a coupling structure of a frame and electronic component according to a second embodiment of the present invention.

Referring to FIGS. 8 to 10, a heat dissipating member according to the present embodiment may be hook-coupled to the electronic component 120. Accordingly, the screw-coupling structure including the first screw hole, the second screw hole, and the screw of the previous embodiment may be omitted.

In detail, the frame 240 comprising the heat dissipating member may be hook-coupled to the electronic component 120. A hook part 260 being bent downward and coupled to the electronic component 120 may be formed on both side surfaces of the first plate portion 241 of the frame 240. The hook part 260 may be inclinedly formed so that the distance from the side surface of the electronic component 120 decreases as it travels downward.

A rib 262 being protruded inward may be formed on an inner surface of the hook part 260. The rib 262 may be disposed at a lower end of the hook part 260 or in a region adjacent to the lower end.

A rib groove 128 to which the rib 262 is coupled may be formed on a side surface of the electronic component 120 by being more depressed than other regions. In a lower surface of the rib 262 and a lower surface of the rib groove 128, an inclined surface 129 being extended more outwardly to the electronic component 120 as it travels towards a downward direction, respectively, may be formed. Accordingly, by pressing the heat dissipating member downward when the heat dissipating member is separated from the electronic component 120, it can slidingly move along the inclined surface 129. In a state where the heat dissipating member and the electronic component 120 are coupled, an upper surface of the rib 262 is caught on an upper surface of the rib groove 128 so that the coupled state can be fixed.

According to the present embodiment, there is an advantage in that the heat dissipating member and the electronic component can be easily separated and coupled.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A power converter comprising:
 a housing which has an inner space part formed therein;
 an electronic component being disposed in the space part, the electronic component being configured to generate heat due to an operation of the electronic component; and
 a heat dissipating member including a first part being disposed on the electronic component and a second part being disposed on an inner surface of the housing,
 wherein the heat dissipating member comprises:
  a frame;
  a heat dissipating pipe being disposed on one surface of the frame; and
  a thermal pad being disposed between the heat dissipating pipe and the electronic component or between the heat dissipating pipe and the inner surface of the housing,
 wherein the heat dissipating pipe has a region bent at least once,
 wherein the frame includes:
  a first plate portion being disposed on the electronic component; and
  a second plate portion facing the inner surface of the housing,
 wherein the first plate portion and the second plate portion are disposed perpendicular to each other,
 wherein the heat dissipating pipe includes:
  a first region being disposed on a lower surface of the first plate portion; and
  a second region being disposed on an outer surface of the second plate portion,
 wherein the first region and the second region are disposed perpendicular to each other,
 wherein the thermal pad includes:
  a first thermal pad being disposed between the first region and an upper surface of the electronic component; and a second thermal pad being disposed between the second region and the inner surface of the housing, wherein the first plate portion includes a first screw hole, wherein the first thermal pad includes a second screw hole facing the first screw hole, and wherein the heat dissipating member is screw-coupled to the electronic component through a screw penetrating the first screw hole and the second screw hole.

2. The power converter according to claim 1, wherein the housing includes:
an upper plate;
a lower plate; and
a side plate connecting the upper plate and the lower plate and forming a side surface, and
wherein the heat dissipating member is in contact with an inner surface of the side plate.

3. The power converter according to claim 1, wherein an accommodating groove being formed by being more recessed inward than other regions to accommodate the second region is disposed on the outer surface of the second plate portion.

4. The power converter according to claim 1, wherein the heat dissipating member further comprises a step portion being protruded downward from the lower surface of the first plate portion, and
wherein a plurality of heat dissipating pipes are disposed to face each other with respect to the step portion.

5. The power converter according to claim 1, wherein the heat dissipating member further comprises a housing coupling portion being extended upward from an upper end of the second plate portion, and
wherein the housing coupling portion is screw-coupled to the inner surface of the housing.

6. The power converter according to claim 1, wherein the heat dissipating pipe is soldered to the one surface of the frame.

7. The power converter according to claim 4, wherein a central groove is formed on an upper surface of the first plate portion corresponding to a formation region of the step portion.

8. The power converter according to claim 1, wherein a cross-sectional area of the first thermal pad is larger than that of the second thermal pad.

9. The power converter according to claim 1, wherein a printed circuit board is disposed on the electronic component and the heat dissipating member.

10. A power converter comprising:
a housing which has an inner space part formed therein;
an electronic component being disposed in the space part, the electronic component being configured to generate heat due to an operation of the electronic component; and
a heat dissipating member including a first part being disposed on the electronic component and a second part being disposed on an inner surface of the housing,
wherein the heat dissipating member comprises:
a frame;
a heat dissipating pipe being disposed on one surface of the frame; and
a thermal pad being disposed between the heat dissipating pipe and the electronic component or between the heat dissipating pipe and the inner surface of the housing,
wherein the heat dissipating pipe has a region bent at least once,
wherein the frame and the electronic component are coupled by hooks,
wherein the frame includes a hook part, and
wherein the electronic component includes a rib groove formed on a side surface to which the hook part is coupled.

11. A power converter comprising:
a housing;
an electronic component disposed in the housing; and
a heat dissipating member coupled to the housing and the electronic component,
wherein the heat dissipating member comprises:
a frame; and
a heat dissipating pipe placed on a surface of the frame, and
wherein the frame includes a groove to which the heat dissipating pipe is coupled,
wherein the frame and the electronic component are coupled by hooks,
wherein the frame includes a hook part, and
wherein the electronic component includes a rib groove formed on a side surface to which the hook part is coupled.

12. The power converter according to claim 11, wherein the frame includes:
a first plate portion being disposed on the electronic component; and
a second plate portion facing an inner surface of the housing, and
wherein the first plate portion and the second plate portion are disposed perpendicular to each other.

13. The power converter according to claim 12, wherein the heat dissipating pipe includes:
a first region being disposed on a lower surface of the first plate portion; and
a second region being disposed on an outer surface of the second plate portion, and
wherein the first region and the second region are disposed perpendicular to each other.

14. The power converter according to claim 13, wherein an accommodating groove being formed by being more recessed inward than other regions to accommodate the second region is disposed on the outer surface of the second plate portion.

15. The power converter according to claim 12, wherein the heat dissipating member further comprises a step portion being protruded downward from a lower surface of the first plate portion, and
wherein a plurality of heat dissipating pipes are disposed to face each other with respect to the step portion.

* * * * *